(12) United States Patent
Poulin et al.

(10) Patent No.: US 10,038,405 B2
(45) Date of Patent: Jul. 31, 2018

(54) APPARATUS AND METHODS FOR MULTI-SUPPLY VOLTAGE POWER AMPLIFIERS

(71) Applicant: Skyworks Solutions, Inc., Woburn, MA (US)

(72) Inventors: Grant Darcy Poulin, Carp (CA); Samir Hammadi, Ottawa (CA); Edward John Wemyss Whittaker, Bishop's Storford (GB)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/280,671

(22) Filed: Sep. 29, 2016

(65) Prior Publication Data
US 2017/0093341 A1 Mar. 30, 2017

Related U.S. Application Data

(60) Provisional application No. 62/235,383, filed on Sep. 30, 2015.

(51) Int. Cl.
| | |
|---|---|
| *H03F 1/30* | (2006.01) |
| *H03F 1/02* | (2006.01) |
| *H03F 3/189* | (2006.01) |
| *H04B 1/40* | (2015.01) |
| *H04B 1/04* | (2006.01) |
| *H03F 3/24* | (2006.01) |

(52) U.S. Cl.
CPC ........... *H03F 1/0233* (2013.01); *H03F 3/189* (2013.01); *H03F 3/24* (2013.01); *H03F 3/245* (2013.01); *H04B 1/04* (2013.01); *H04B 1/0475* (2013.01); *H04B 1/40* (2013.01); *H03F 2200/336* (2013.01); *H03F 2200/391* (2013.01); *H03F 2200/468* (2013.01); *H03F 2200/78* (2013.01); *H04B 2001/0408* (2013.01)

(58) Field of Classification Search
CPC ........................................................ H03F 1/30
USPC ................................................. 330/127, 297
See application file for complete search history.

(56) References Cited

U.S. PATENT DOCUMENTS

| | | | | |
|---|---|---|---|---|
| 5,808,542 A | * | 9/1998 | Hwang ................ | G08B 3/1025 340/384.7 |
| 6,822,511 B1 | | 11/2004 | Doherty et al. | |
| 7,102,442 B2 | * | 9/2006 | Anderson .............. | H03G 3/004 330/285 |
| 7,348,853 B2 | * | 3/2008 | Camnitz .............. | H03G 3/3042 330/285 |
| 7,808,323 B2 | * | 10/2010 | Takinami ................ | G05F 1/565 330/296 |

(Continued)

*Primary Examiner* — Henry Choe
(74) *Attorney, Agent, or Firm* — Knobbe Martens Olson & Bear LLP

(57) ABSTRACT

Apparatus and methods for power amplifiers that can operate under a wide range of supply voltages are disclosed herein. In certain implementations, a method of adjusting a parameter of a power amplifier is provided. The method includes detecting a value of a supply voltage provided to the power amplifier. The method further includes selecting a first value from a plurality of values for a first parameter of the power amplifier based on the detected value of the supply voltage. The method further includes adjusting the first parameter of the power amplifier to the first value.

17 Claims, 7 Drawing Sheets

(56) References Cited

U.S. PATENT DOCUMENTS

| | | | | |
|---|---|---|---|---|
| 7,859,336 B2* | 12/2010 | Markowski | ........... | H03F 1/0227 |
| | | | | 330/136 |
| 8,160,519 B2* | 4/2012 | Nentwig | ............... | H03F 1/0211 |
| | | | | 375/285 |
| 8,222,959 B2* | 7/2012 | Jang | ...................... | H03F 1/0216 |
| | | | | 330/127 |
| 8,588,714 B2* | 11/2013 | Camuffo | ............... | H03F 1/0211 |
| | | | | 455/114.3 |
| 9,000,847 B2* | 4/2015 | Zhao | ........................ | H03F 1/42 |
| | | | | 330/302 |
| 9,859,944 B2 | 1/2018 | Whittaker et al. | | |
| 9,882,538 B2 | 1/2018 | Poulin et al. | | |
| 2010/0060358 A1* | 3/2010 | Nentwig | ............... | H03F 1/0211 |
| | | | | 330/199 |
| 2016/0285503 A1 | 9/2016 | Poulin et al. | | |

* cited by examiner

APPARATUS AND METHODS FOR MULTI-SUPPLY VOLTAGE POWER AMPLIFIERS

CROSS-REFERENCE TO RELATED APPLICATIONS

This application claims the benefit of priority under 35 U.S.C. § 119(e) of U.S. Provisional Patent Application No. 62/235,383, filed Sep. 30, 2015 and titled "APPARATUS AND METHODS FOR MULTI-SUPPLY VOLTAGE POWER AMPLIFIERS," which is hereby incorporated by reference herein in its entirety.

BACKGROUND

Field

Embodiments of the invention relate to electronic systems, and in particular, to power amplifiers for radio frequency (RF) electronics that can operate using different supply voltages.

Description of the Related Technology

Power amplifiers can be included in fixed and mobile devices to amplify radio frequency (RF) signals for transmission via antennas. For example, in devices using the WLAN IEEE 802.11 standard (commonly referred to as WI-FI), such as the IEEE 802.11ac standard, a power amplifier can be used to provide amplification to one or more transmit carrier frequencies.

Many power amplifiers, such as power amplifiers that are designed to meet 256 quadrature amplitude modulation (QAM) or 1024 QAM operation, have stringent linearity requirements (e.g., stringent requirements for the range of voltages for which a change in an amplitude of a signal at an input of the power amplifier results in a proportional, linear change of an amplitude of a signal at an output of the power amplifier). To meet such requirements, bias voltages, bias currents, load lines, and/or other parameters of the power amplifier are optimized for an expected supply voltage.

SUMMARY

In certain embodiments, the present disclosure relates to a method of adjusting a parameter of a power amplifier. The method includes detecting a value of a supply voltage provided to the power amplifier; selecting a first value from a plurality of values for a first parameter of the power amplifier based on the detected value of the supply voltage; and adjusting the first parameter of the power amplifier to the first value.

The method of the preceding paragraph can have any sub-combination of the following features: where detecting a value of a supply voltage provided to the power amplifier includes comparing the supply voltage to a reference voltage to detect the value of the supply voltage; where adjusting the first parameter of the power amplifier includes switching a matching structure into an output signal path of the power amplifier; where the method further comprises detecting a value of a temperature of the power amplifier; where selecting a first value from a plurality of values for a first parameter of the power amplifier includes selecting the first value based on the detected value of the supply voltage and the detected value of the temperature of the power amplifier; and where the first parameter is at least one of a bias, a dynamic compensation, or a load line.

In certain embodiments, the present disclosure relates to a power amplifier parameter control system. The power amplifier parameter control system includes a power amplifier configured to amplify a radio frequency signal; a supply voltage detection circuit configured to detect a supply voltage provided to the power amplifier; and a parameter controller configured to select a first value from a plurality of values for a first parameter of the power amplifier based on the detected value of the supply voltage, the parameter controller further configured to set the first parameter of the power amplifier to the first value.

The power amplifier parameter control system of the preceding paragraph can have any sub-combination of the following features: where the supply voltage detection circuit includes a comparator configured to compare the supply voltage to a reference voltage to detect the value of the supply voltage; where the power amplifier parameter control system further comprises a switch and a matching structure coupled to the switch, the matching structure including at least one capacitor and at least one inductor; where the parameter controller is configured to enable the switch to switch the matching structure into an output signal path of the power amplifier such that the value of the first parameter is the first value; where the parameter controller includes a plurality of registers that each store one value from the plurality of values; where the supply voltage detection circuit includes a diode and a voltage detector configured to detect a value of a voltage across the diode, the value of the voltage indicating a temperature value; where the parameter controller is configured to select the first value based on the detected value of the supply voltage and the indicated temperature value; and where the first parameter is at least one of a bias, a dynamic compensation, or a load line.

In certain embodiments, the present disclosure relates to a wireless device. The wireless device includes a transceiver configured to generate a first radio frequency signal; a power amplifier configured to amplify the first radio frequency signal; and a control component configured to detect a supply voltage provided to the power amplifier, the control component configured to select a first value from a plurality of values for a first parameter of the power amplifier based on the detected value of the supply voltage, the control component configured to set the first parameter of the power amplifier to the first value.

The wireless device of the preceding paragraph can have any sub-combination of the following features: where the control component includes a comparator configured to compare the supply voltage to a reference voltage to detect the value of the supply voltage; where the wireless device further comprises a switch and a matching structure coupled to the switch, the matching structure including at least one capacitor and at least one inductor; where the control component is configured to enable the switch to switch the matching structure into an output signal path of the power amplifier such that the value of the first parameter is the first value; where the control component includes a plurality of registers that each store one value from the plurality of values; and where the first parameter is at least one of a bias, a dynamic compensation, or a load line.

DETAILED DESCRIPTION OF EMBODIMENTS

The headings provided herein, if any, are for convenience only and do not necessarily affect the scope or meaning of the claimed invention.

As described above, many power amplifiers, such as power amplifiers that are designed to meet 256 QAM or 1024 QAM operation, have stringent linearity requirements and power amplifier parameters are optimized for an expected supply voltage to meet the requirements. However, it can be beneficial for a power amplifier to be able to operate over a wide range of operating voltages. For example, 3.3V and 5V are common supply voltages provided to power amplifiers in various electronic devices.

Generally, a power amplifier is optimized for a single supply voltage. Thus, a first power amplifier is fabricated with a first set of parameters that are optimized for a first supply voltage, a second power amplifier is fabricated with a second set of parameters that are optimized for a second supply voltage, and the first power amplifier is included on the printed circuit board (PCB) of an electronic device that provides the first supply voltage (or otherwise integrated with the circuitry of the electronic device) and the second power amplifier is included on the PCB of another electronic device that provides the second supply voltage (or otherwise integrated with the circuitry of the other electronic device). Because the power amplifier parameters are generally optimized for an expected, single supply voltage a priori, many power amplifiers that are provided with a range of supply voltages cannot meet the linearity requirements for each of the supply voltages within the range.

Accordingly, in certain embodiments, a supply voltage detection circuit and a parameter controller are provided herein that allow a single power amplifier to receive a wide range of supply voltages and still meet the linearity requirements for each of the supply voltages within the range. Thus, a single power amplifier can be integrated into any electronic device, regardless of the supply voltage provided by the electronic device (and regardless of whether the supply voltage provided by the electronic device changes over time). For example, the supply voltage detection circuit is configured to detect a supply voltage being supplied to a power amplifier. The results of the supply voltage detection circuit are provided to the parameter controller that, using the results of the supply voltage detection circuit, adjusts the parameters of the power amplifier to values that are optimized for the detected supply voltage. As used herein, power amplifier parameters may include a bias value (e.g., current, voltage, etc.), a dynamic compensation value, a load line, and/or the like.

Figure 1:
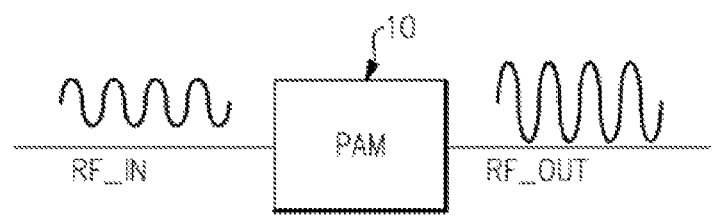
FIG. 1 is a schematic diagram of a power amplifier module for amplifying a radio frequency (RF) signal.

FIG. 1 is a schematic diagram of a power amplifier module (PAM) 10 for amplifying a radio frequency (RF) signal. The illustrated power amplifier module 10 amplifies an RF signal (RF_IN) to generate an amplified RF signal (RF_OUT). As described herein, the power amplifier module 10 can include one or more power amplifiers.

Figure 2:
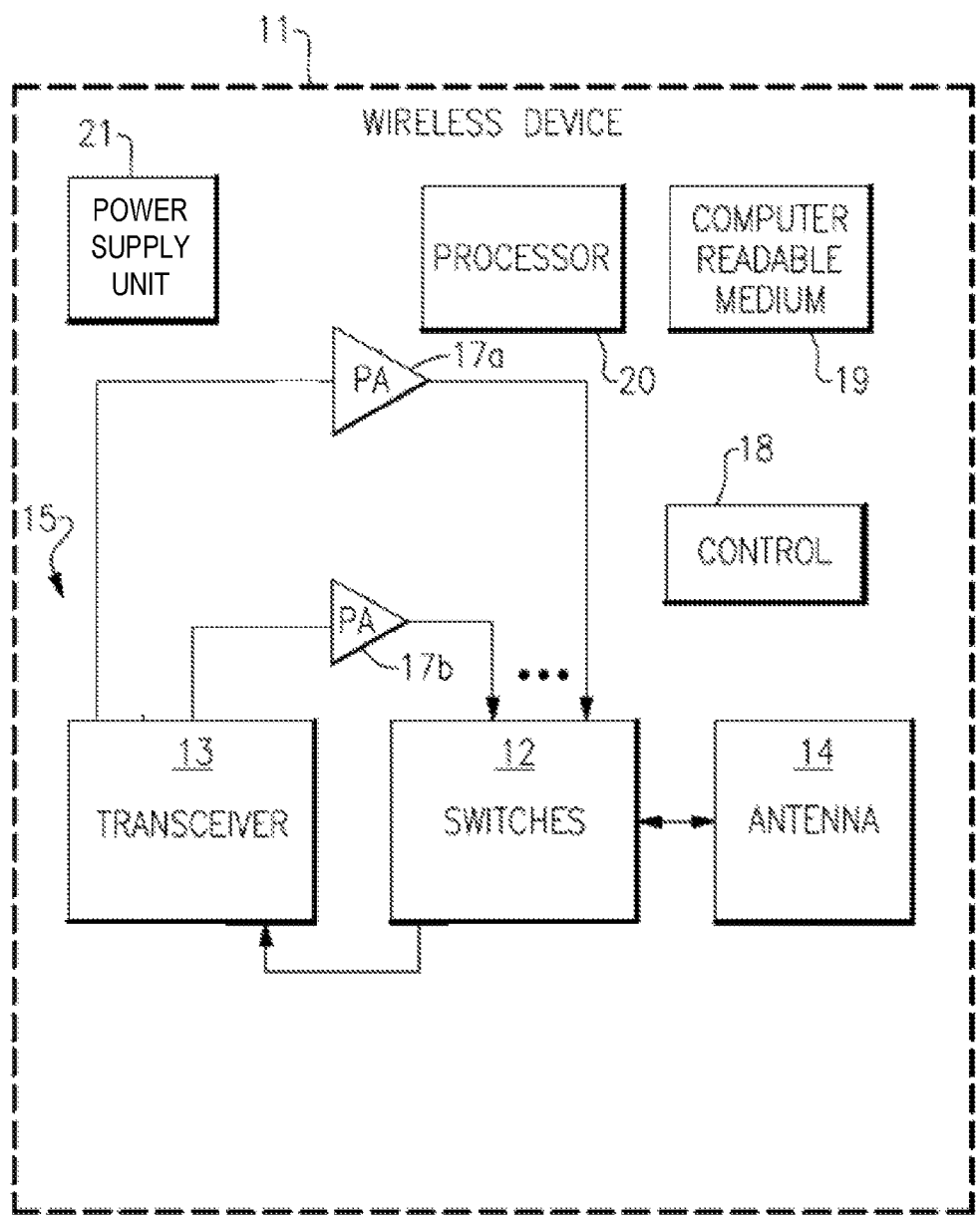
FIG. 2 is a schematic diagram of an example wireless device that can include one or more of the power amplifier modules of FIG. 1.

FIG. 2 is a schematic block diagram of an example wireless or mobile device 11 that can include one or more of the power amplifier modules 10 of FIG. 1. The wireless device 11 can also include an envelope tracking system.

The example wireless device 11 depicted in FIG. 2 can represent a wireless access point, or a mobile device such as a multi-band/multi-mode mobile phone. By way of example, WLAN devices operate in many regions of the world, and operate in either the 2.4-2.5 GHz or 5-6 GHz frequency bands. Power amplifiers that operate in these bands are generally designed to achieve very high degrees of linearity.

One or more features of the present disclosure can be implemented in the foregoing example modes and/or bands, and in other communication standards. For example, IEEE 802.11 (e.g., IEEE 802.11ac), 2G, 3G, 4G, Long Term Evolution (LTE), and Advanced LTE are non-limiting examples of such standards. To increase data rates, the wireless device 11 can operate using complex modulated signals, such as 64 QAM signals, 256 QAM signals, 1024 QAM signals, etc.

In certain embodiments, the wireless device 11 can include switches 12, a transceiver 13, an antenna 14, power amplifiers 17a, 17b, a control component 18, a computer readable medium 19, a processor 20, and a power supply unit 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

The antenna 14 can receive a signal that is provided to the transceiver 13 and can transmit a signal provided by the power amplifiers 17a, 17b. The switches 12 can be configured to facilitate switching between a receive mode (e.g., a signal received by the antenna 14 is provided to the transceiver 13) and a transmit mode (e.g., a signal is provided to the antenna 14 for transmission).

FIG. 2 shows that in certain embodiments, a control component 18 can be provided for controlling various control functionalities associated with operations of the switches 12, the power amplifiers 17a, 17b, and/or other operating components. For example, the control component 18 can include a supply voltage detection circuit that detects a value of a supply voltage provided to the power amplifiers 17a, 17b and/or a parameter controller that adjusts the power amplifier parameters of the power amplifiers 17a, 17b based on the detected supply voltage value. The supply voltage detection circuit and the parameter controller are described in greater detail below with respect to FIGS. 3-8.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The power supply unit 21 can be any regulator or suitable battery for use in the wireless device 11. For example, the power supply unit 21, if a regulator, can be configured to supply one of a plurality of discrete supply voltages (e.g., either 3.3V or 5V). The power supply unit 21, if a battery, such as a lithium-ion battery, can supply a range of supply voltages (e.g., from 2.7V to 4.6V). If the power supply unit 21 is a battery, the power consumed from the power supply unit 21 can be reduced to improve the battery life of the wireless device 11. In certain configurations, the power amplifiers 17a, 17b can be implemented using CMOS processing, which can lower cost and/or enhance integration. However, other configurations of the power amplifiers 17a, 17b are possible. For example, the power amplifiers 17a, 17b can be implemented using III-V semiconductor processing, such as Gallium Arsenide (GaAs) processing.

Power amplifiers can be included in radio frequency systems to amplify a wireless local area network (WLAN) signal for transmission. For example, certain wireless devices can communicate using not only cellular standards, but also using other communication standards, including, for example, a WLAN standard such as WI-FI or IEEE 802.11 (e.g., IEEE 802.11ac), as described herein.

In certain configurations, a WLAN power amplifier system includes a WLAN power amplifier and an output impedance matching network. The WLAN power amplifier includes an input that receives a WLAN signal and an output that generates an amplified WLAN signal for transmission over an antenna. The output impedance matching network is electrically connected to the output of the WLAN power amplifier, and can provide a load line impedance between 5Ω and 35Ω at a fundamental frequency of the WLAN signal.

Figure 3:
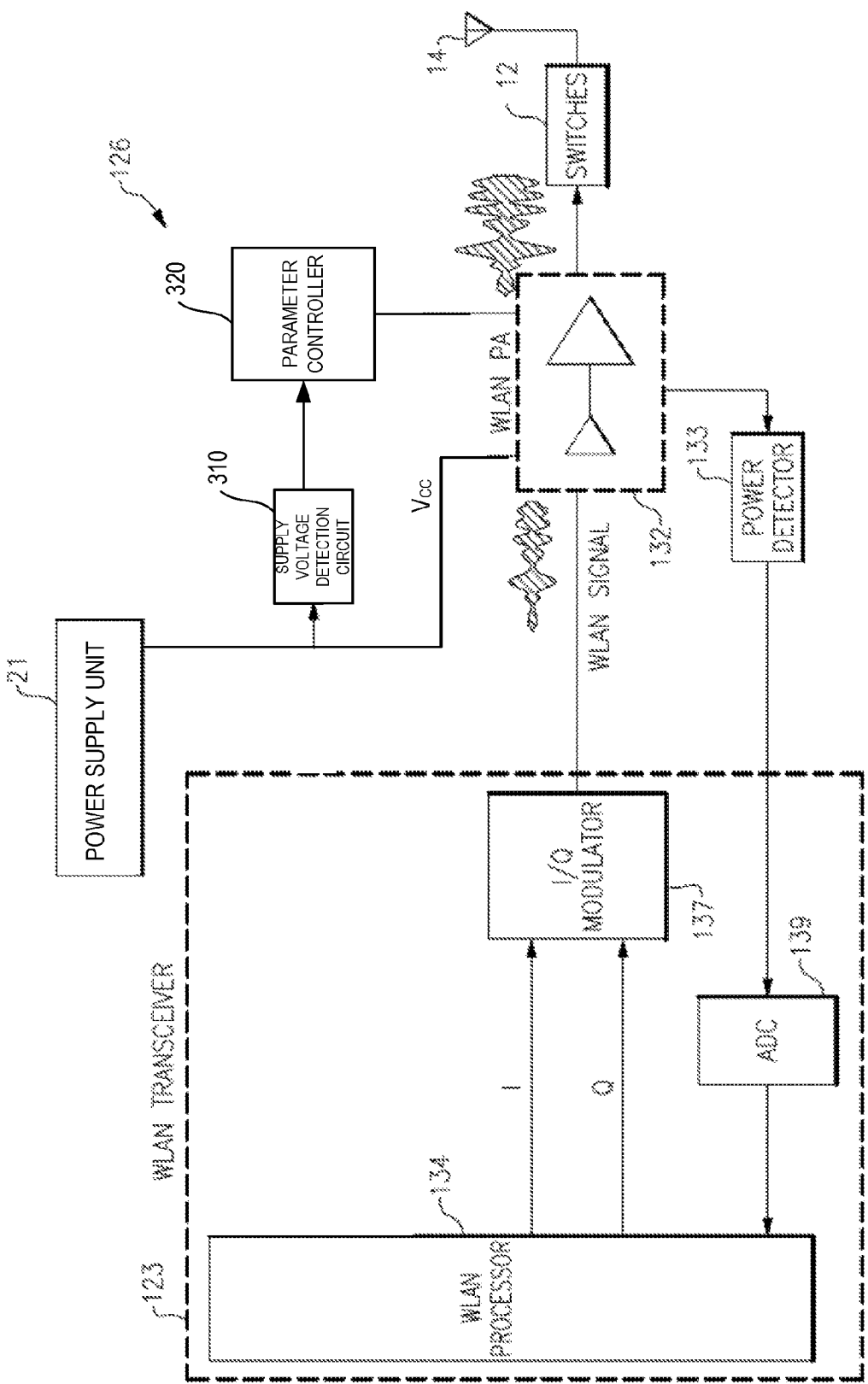
FIG. 3 is a schematic diagram of one embodiment of a WLAN power amplifier system including a supply voltage detection circuit and a parameter controller.

FIG. 3 is a schematic diagram of one embodiment of a WLAN power amplifier system 126. The WLAN power amplifier system 126 includes the power supply unit 21, the switches 12, the antenna 14, a WLAN transceiver 123, a WLAN power amplifier 132, a power detector 133, a supply voltage detection circuit 310, and a parameter controller 320. The illustrated WLAN transceiver 123 includes a WLAN processor 134, an I/Q modulator 137, and an analog-to-digital converter (ADC) 139. Although not illustrated in FIG. 3 for clarity, the WLAN transceiver 123 can include circuitry associated with receiving signals over one or more receive paths.

The WLAN power amplifier system 126 can be included in a wireless device, such as the wireless device 11, that is operable to transmit and receive WLAN signals, such as WI-FI signals. For example, the wireless device 11 can be used to communicate with WI-FI devices, including, for instance, wearable electronics such as wireless headsets or wrist watches, and/or to communicate over the Internet using a wireless access point or hotspot. Although FIG. 3 illustrates one example of a WLAN power amplifier system that can include one or more WLAN power amplifiers, the WLAN power amplifier systems described herein can be used in other wireless devices and electronics that include one or more power amplifiers.

The illustrated WLAN transceiver 123 generates a WLAN transmit signal that is received by the WLAN power amplifier 132. The WLAN power amplifier 132 amplifies the WLAN transmit signal to generate an amplified WLAN signal that is provided to the switches 12. The switches 12 can be configured to transmit the amplified WLAN signal to the antenna 14, which is used to transmit the WLAN signal. The antenna 14 can also receive signals associated with WLAN. Although the disclosure is described herein with respect to WLAN, this is not meant to be limiting. For example, the antenna 14 can transmit and receive signals associated with Bluetooth, FM radio, and/or other configurations.

The WLAN signal processor 134 can be used to generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 137 in a digital format. The WLAN processor 134 can be any suitable processor configured to process a WLAN signal. For instance, the WLAN processor 134 can include a digital signal processor, a microprocessor, a programmable core, or any combination thereof. Furthermore, in some implementations, the WLAN processor 134 can be configured to provide additional functionality, such as processing associated with FM signals, Bluetooth signals, and/or mobile TV signals.

The I/Q modulator 137 can be configured to receive the I and Q signals from the WLAN processor 134 and to process the I and Q signals to generate a WLAN signal. For example, the I/Q modulator 137 can include digital-to-analog converters (DACs) configured to convert the I and Q signals into an analog format, mixers for upconverting the I and Q signals to radio frequency, and a signal combiner for combining the upconverted I and Q signals into a WLAN signal suitable for amplification by the WLAN power amplifier 132. In certain implementations, the I/Q modulator 137 can include one or more filters configured to filter frequency content of signals processed therein.

In the illustrated configuration, the WLAN power amplifier 132 receives a power supply voltage $V_{CC}$ from the power supply unit 21 (e.g., either directly from a battery or a regulator) and/or from an external regulator (not shown). The supply voltage $V_{CC}$ can be used to power the WLAN power amplifier 132. Although the WLAN power amplifier system 126 illustrates a configuration including two cascading power amplifiers, the WLAN power amplifier system 126 can be adapted to include non-cascading power amplifiers and/or more or fewer power amplifiers.

The supply voltage detection circuit 310 can receive the supply voltage $V_{CC}$ and detect the voltage value of the supply voltage $V_{CC}$. In some embodiments, the supply voltage detection circuit 310 does not measure the actual supply voltage value, but rather determines which previously identified possible supply voltage values are not being provided to the WLAN power amplifier 132, as described in greater detail below with respect to FIGS. 4 and 5. The supply voltage detection circuit 310 can independently detect the supply voltage value for any power amplifier in the WLAN power amplifier system 126. The supply voltage detection circuit 310 can transmit individual indications of the detected supply voltages to the parameter controller 320.

In some embodiments, the parameter controller 320 uses the indication of a detected supply voltage to select one or more power amplifier parameter values. The parameter controller 320 can directly adjust one or more parameters of the power amplifier to match the selected values and/or can enable or disable a switch (or similar logic component) to switch in or out components that affect the values of one or more power amplifier parameters. For example, the parameter controller 320 can store a set of power amplifier parameter values (e.g., in logic registers, in a table, etc.). If the indication received from the supply voltage detection circuit 310 indicates that a first supply voltage is being provided to the WLAN power amplifier 132, then the parameter controller 320 can select a subset of the stored power amplifier parameter values that are optimized for the first supply voltage. Alternatively, if the indication received from the supply voltage detection circuit 310 indicates that a second supply voltage is being provided to the WLAN power amplifier 132, then the parameter controller 320 can select a second subset of the stored power amplifier parameter values that are optimized for the second supply voltage, and so on. The parameter controller 320 can then adjust the values of the parameters of the WLAN power amplifier 132 to match the selected subset. To adjust a load line of the WLAN power amplifier 132, for example, the parameter controller 320 can switch in or out a matching network that is optimized for the first supply voltage (or whichever supply voltage value is detected).

The WLAN power amplifier 132 can receive the WLAN signal from the I/Q modulator 137 of the WLAN transceiver 123, and can provide an amplified WLAN signal to the antenna 14 through the switches 12.

In certain configurations, the WLAN power amplifier 132 can include an input stage and an output stage arranged in a cascade, and the power detector 133 can measure an output power of the input stage. The detected power signal from the power detector 133 can be provided to the ADC 139, which can convert the detected power signal to a digital format suitable for processing by the WLAN processor 134.

By including a feedback path from the WLAN power amplifier 132 to the WLAN processor 134, the WLAN processor 134 can be used to dynamically adjust the I and Q signals to optimize the operation of the WLAN power amplifier system 126. For example, configuring the WLAN power amplifier system 126 in this manner can aid in controlling the power added efficiency (PAE), error vector magnitude (EVM), and/or linearity of the WLAN power amplifier 132.

The WLAN power amplifier 132 can include one or more output impedance matching networks (not illustrated in FIG. 3). In certain configurations described herein, an output impedance matching network is tuned to have a high load line impedance at a fundamental frequency of the WLAN signal relative to that of a conventional WLAN power amplifier system given a certain supply voltage. For example, in certain configurations, the output impedance matching network of the WLAN power amplifier 132 can provide a load line impedance between 5Ω and 35Ω at the fundamental frequency of the WLAN signal amplified by the WLAN power amplifier 132. Typically, for a given desired output power, if the supply voltage increases, the optimum output impedance will also increase to achieve maximum efficiency and linearity. Providing the WLAN power amplifier 132 with a high load line impedance at high supply voltages, and with a lower load line at lower supply voltages, can maximize linearity and efficiency for both supply voltages. As described herein, the parameter controller 320 can determine, based on a detected supply voltage, which of the output impedance matching networks to switch into the output signal path of the WLAN power amplifier 132.

Although FIG. 3 illustrates a particular configuration of a WLAN power amplifier system, other configurations are possible, including for example, configurations in which the WLAN transceiver 123 includes more or fewer components and/or a different arrangement of components.

Figure 4:
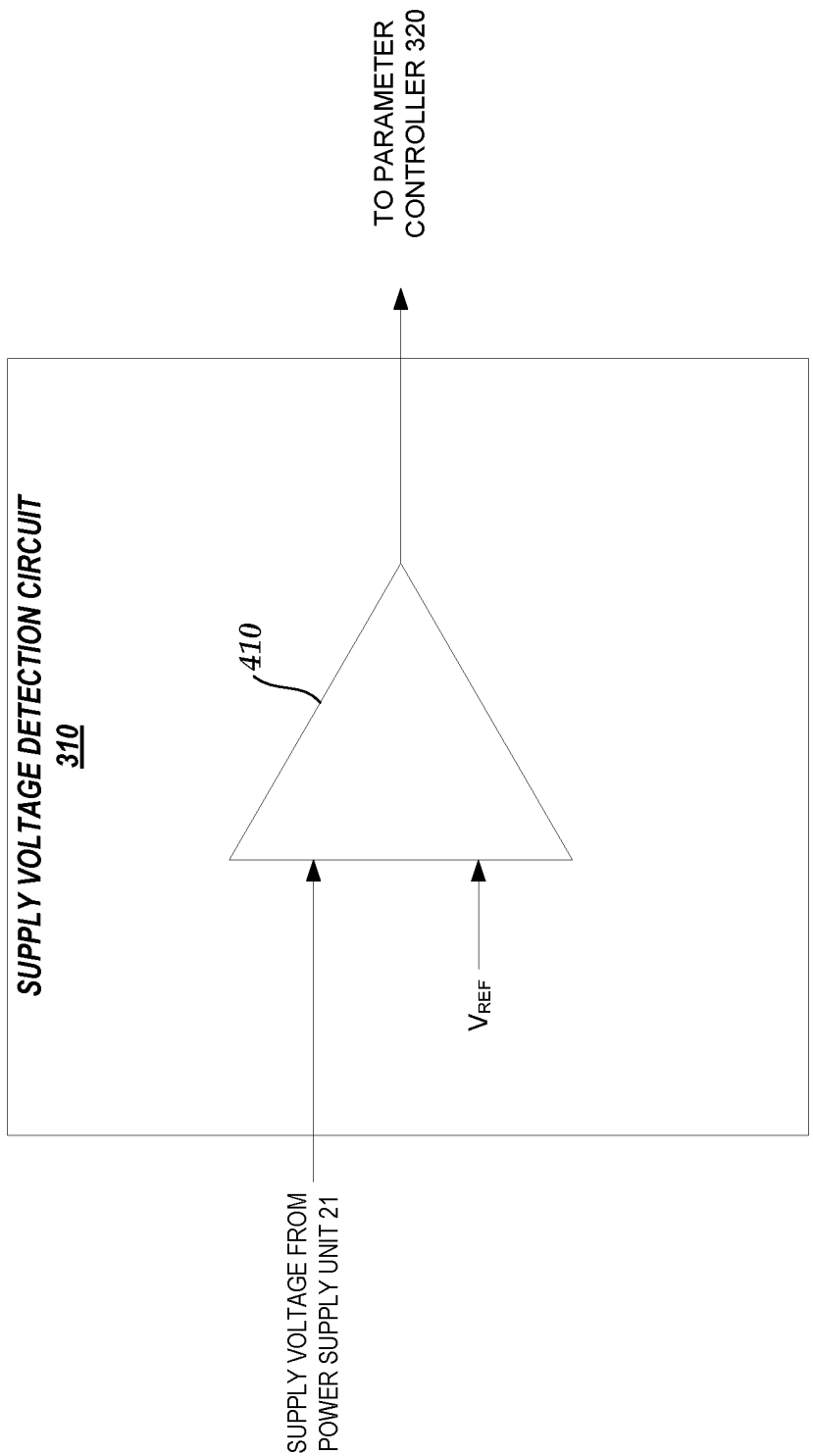
FIG. 4 is a schematic diagram of one embodiment of a supply voltage detection circuit illustrated in FIG. 3.

FIG. 4 is a schematic diagram of one embodiment of the supply voltage detection circuit 310 illustrated in FIG. 3. The embodiment illustrated in FIG. 4 is for cases in which the power amplifier is supplied with one of two possible supply voltages (e.g., 3.3V or 5V). As illustrated in FIG. 4, the supply voltage detection circuit 310 includes a comparator 410. The comparator 410 receives as a first input a supply voltage from the power supply unit 21 (or any other component that provides a supply voltage to a power amplifier). The comparator 410 receives as a second input a reference voltage $V_{REF}$. The reference voltage may be at a voltage level that is between the two possible supply voltages (e.g., 4V if the supply voltage is either 3.3V or 5V). The comparator can generate a high signal (e.g., a logical 1) if the supply voltage received from the WLAN transceiver 123 is greater than the reference voltage $V_{REF}$ (e.g., indicating that the supply voltage is 5V) and can generate a low signal (e.g., a logical 0) if the supply voltage received from the WLAN transceiver 123 is less than the reference voltage $V_{REF}$ (e.g., indicating that the supply voltage is 3.3V). The signal generated by the supply voltage detection circuit 310 can be transmitted to the parameter controller 320.

Figure 5:
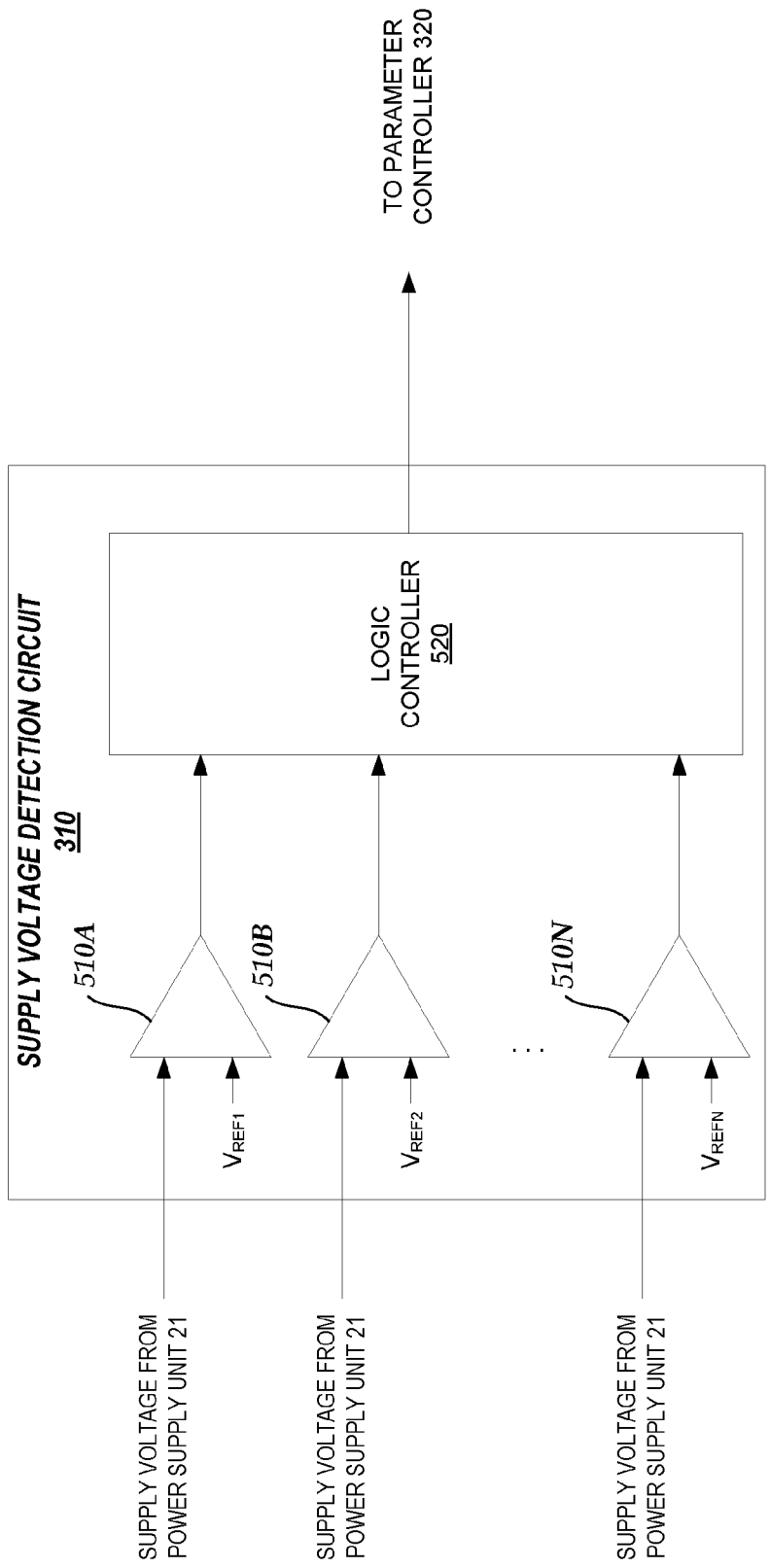
FIG. 5 is a schematic diagram of another embodiment of a supply voltage detection circuit illustrated in FIG. 3.

FIG. 5 is a schematic diagram of another embodiment of the supply voltage detection circuit 310 illustrated in FIG. 3. The embodiment illustrated in FIG. 5 is for cases in which the power amplifier is supplied with one of many (e.g., more than two) possible supply voltages. As illustrated in FIG. 5, the supply voltage detection circuit 310 includes comparators 510A-N and a logic controller 520. The number of comparators 510A-N may be dependent on the number of supply voltages that can be provided to the power amplifier. For example, the number of comparators 510A-N can be one less than the number of supply voltages that can be provided to the power amplifier.

A comparator 510A-N receives as a first input a supply voltage from the power supply unit 21 (or any other component that provides a supply voltage to a power amplifier). The comparator 510A-N receives as a second input a reference voltage $V_{REF1}$–$V_{REFN}$. Each comparator 510A-N may receive a different reference voltage $V_{REF1}$–$V_{REFN}$, where each reference voltage $V_{REF1}$–$V_{REFN}$ has a voltage value that is between two possible supply voltage values. For example, if three different supply voltages 1.2V, 3.3V, and 5V could be provided to a power amplifier, the supply voltage detection circuit 310 includes two comparators 510A and 510B. The reference voltage $V_{REF1}$ provided as an input to the comparator 510A may be 4V and the reference voltage $V_{REF2}$ provided as an input to the comparator 510B may be 2V.

Each comparator 510A-N can generate a high signal (e.g., a logical 1) if the supply voltage received from the envelope tracker 30 is greater than the reference voltage $V_{REF1}$-$V_{REFN}$ and can generate a low signal (e.g., a logical 0) if the supply voltage received from the WLAN transceiver 123 is less than the reference voltage $V_{REF1}$-$V_{REFN}$. The signals produced by the comparators 510A-N are then transmitted to the logic controller 520. Using the signals received from the comparators 510A-N, the logic controller 520 can determine which supply voltage from a plurality of supply voltages is provided to the power amplifier. For example, if three different supply voltages 1.2V, 3.3V, and 5V could be provided to the power amplifier, then the supply voltage detection circuit 310 includes two comparators 510A and 510B as described above. If the signal produced by the comparator 510A is high, then the logic controller 520 determines that the supply voltage being provided to the power amplifier is the highest voltage (e.g., 5V). If the signal produced by the comparator 510A is low and the signal produced by the comparator 510B is high, then the logic controller 520 determines that the supply voltage being provided to the power amplifier is the middle voltage (e.g., 3.3V). If the signal produced by the comparator 510A is low and the signal produced by the comparator 510B is low, then the logic controller 520 determines that the supply voltage being provided to the power amplifier is the lowest voltage (e.g., 1.2V). The logic controller 520 can use this process to determine the supply voltage when any number of possible supply voltages could be provided to the power amplifier. The logic controller 520 can generate a signal representing the detected supply voltage and transmit this signal to the parameter controller 320.

In further embodiments, the supply voltage detection circuit 310 further detects a temperature of the wireless device 11 (e.g., a temperature of the control component 18, the power amplifiers 17a, 17b, the WLAN power amplifier 132, etc.). For example, the supply voltage detection circuit 310 can detect the temperature by using a voltage detector to measure the voltage across a diode, where the value of the measured voltage is temperature-dependent. The detected temperature can be used in conjunction with the detected supply voltage by the parameter controller 320 to determine which power amplifier parameters to select and provide to the power amplifier.

Figure 6:
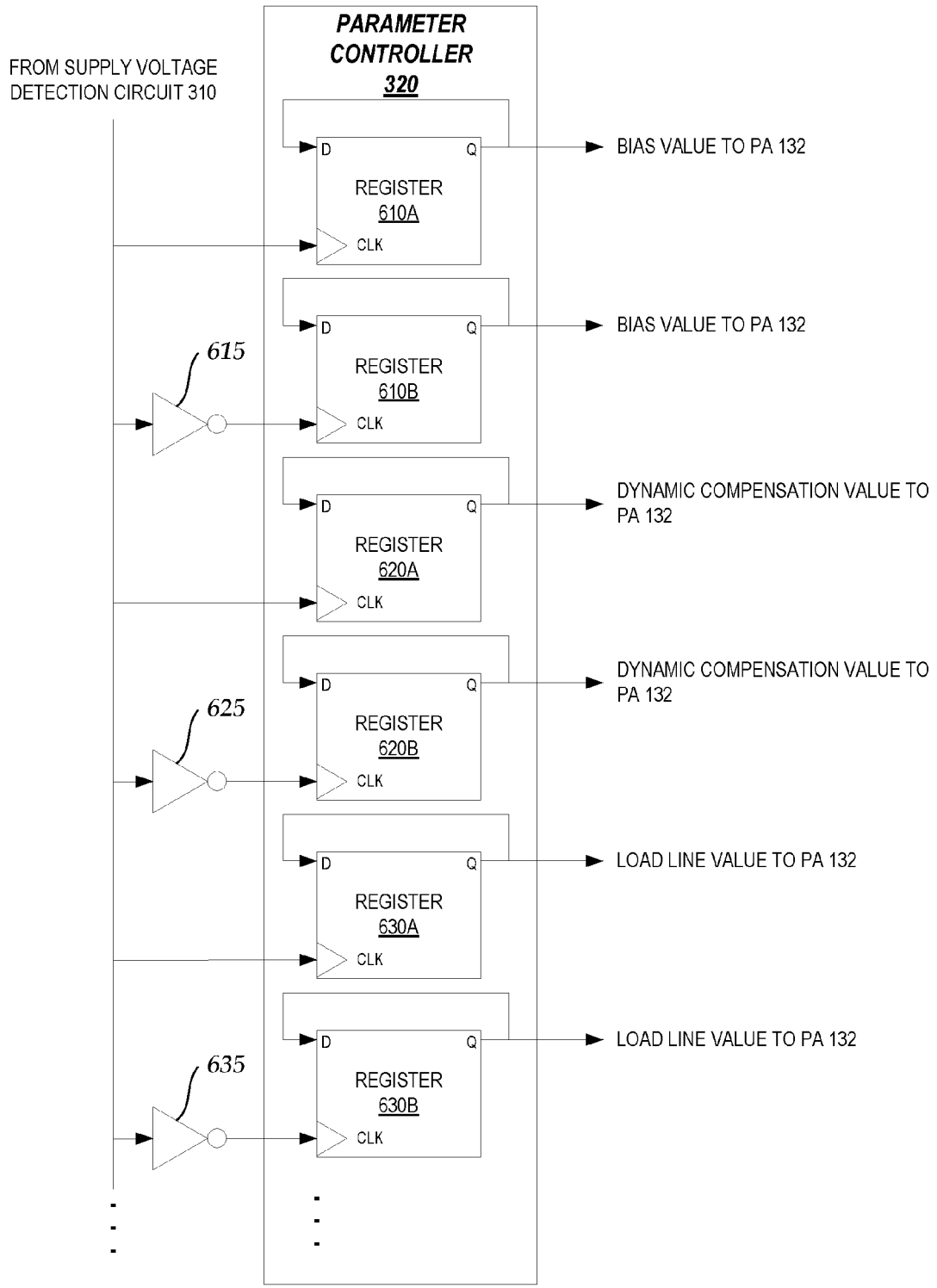
FIG. 6 is a schematic diagram of one embodiment of a parameter controller illustrated in FIG. 3.

FIG. 6 is a schematic diagram of one embodiment of the parameter controller 320 illustrated in FIG. 3. The embodiment illustrated in FIG. 4 is for cases in which the power amplifier is supplied with one of two possible supply voltages (e.g., 3.3V or 5V). As illustrated in FIG. 6, the parameter controller 320 includes registers 610A-B, 620A-B, and 630A-B. A power amplifier parameter may be associated with a pair of registers. For example, the bias power amplifier parameter can be associated with registers 610A-B, the dynamic compensation power amplifier parameter can be associated with registers 620A-B, and the load line power amplifier parameter can be associated with registers 630A-B. Additional register pairs may be included in the parameter controller 320 for each additional power amplifier parameter that is controlled by the parameter controller 320. In further embodiments, additional registers, not shown, are associated with a power amplifier parameter. For example, if there are additional possible supply voltages that can be provided to the power amplifier (e.g., more than 2), then additional registers may be used to store additional values optimized for different supply voltages. The number of registers associated with a power amplifier parameter may then be equal to the number of possible supply voltages that can be provided to a power amplifier. As another example, the optimized power amplifier parameter value may depend on the temperature as well as the detected supply voltage. Thus, additional registers can be used to store additional values that optimized for different supply voltages and/or temperatures.

Each register 610A-B, 620A-B, 630A-B can store a parameter value (or a signal that switches in or out additional components) that is optimized for one of the possible supply voltages. For example, registers 610A, 620A, and 630A can store parameter values (or signals that switch in or out voltages, currents, and/or additional components) that are optimized for the 5V supply voltage and registers 610B, 620B, and 630B can store parameter values (or signals that switch in or out voltages, currents, and/or additional components) that are optimized for the 3.3V supply voltage.

The output of each register 610A-B, 620A-B, 630A-B can be coupled to the respective register input. Thus, each register 610A-B, 620A-B, 630A-B produces the same output each time the respective register is enabled.

The signal generated by the supply voltage detection circuit 310 can be a logical high (e.g., 1) or a logical low (e.g., 0) and can be used to determine which registers 610A-B, 620A-B, 630A-B are enabled and generate an output and which registers 610A-B, 620A-B, 630A-B are not enabled and do not generate an output. For example, the signal generated by the supply voltage detection circuit 310 can be coupled to the clock input of registers 610A, 620A, and 630A. Thus, if the signal generated by the supply voltage detection circuit 310 is high (e.g., meaning that the detected supply voltage is 5V), then the registers 610A, 620A, and 630A (and not the registers 610B, 620B, and 630B) generate an output.

The signal generated by the supply voltage detection circuit 310 can also be coupled to inverters 615, 625, and 635. The inverters 615, 625, 635 generate a high signal if a low signal is received as an input and generate a low signal if a high signal is received as an input. The outputs of the inverters 615, 625, and 635 are coupled to the clock inputs of registers 610B, 620B, and 630B, respectively. Thus, if the signal generated by the supply voltage detection circuit 310 is low (e.g., meaning that the detected supply voltage is 3.3V), then the registers 610B, 620B, and 630B (and not the registers 610A, 620A, and 630A) generate an output because the inverters 615, 625, and 635 invert the signal generated by the supply voltage detection circuit 310 before the signal reaches the clock input.

In further embodiments, not shown, the parameter controller 320 uses the temperature detected by the supply voltage detection circuit 310 in conjunction with the signal generated by the supply voltage detection circuit 310 (that indicates the detected supply voltage) to determine which registers 610A-B, 620A-B, 630A-B (and/or additional registers, not shown) to enable. For example, logic circuits (such as AND circuits, OR circuits, etc.) can receive the indication of the detected supply voltage and the indication of the detected temperature to select which registers to enable and/or which to disable.

The outputs generated by the registers 610A-B, 620A-B, and 630A-B can be transmitted directly to a power amplifier, such as the power amplifier 17a, 17b or the WLAN power amplifier 132, to adjust one or more parameters of the power amplifier. For example, registers 610A-B can store a bias voltage value or a bias current value and this stored value can be provided by registers 610A-B to the power amplifier. Alternatively, the outputs generated by the registers 610A-B, 620A-B, and 630A-B can enable another component (such as a switch) to determine which power amplifier parameter values to select and change the power amplifier parameter values accordingly. For example, registers 630A-B can store signals that determine whether a switch should be open or closed, where the switch affects the load line of the power amplifier by switching in a matching structure (when enabled). These examples are described in greater detail below with respect to FIG. 7.

Figure 7:
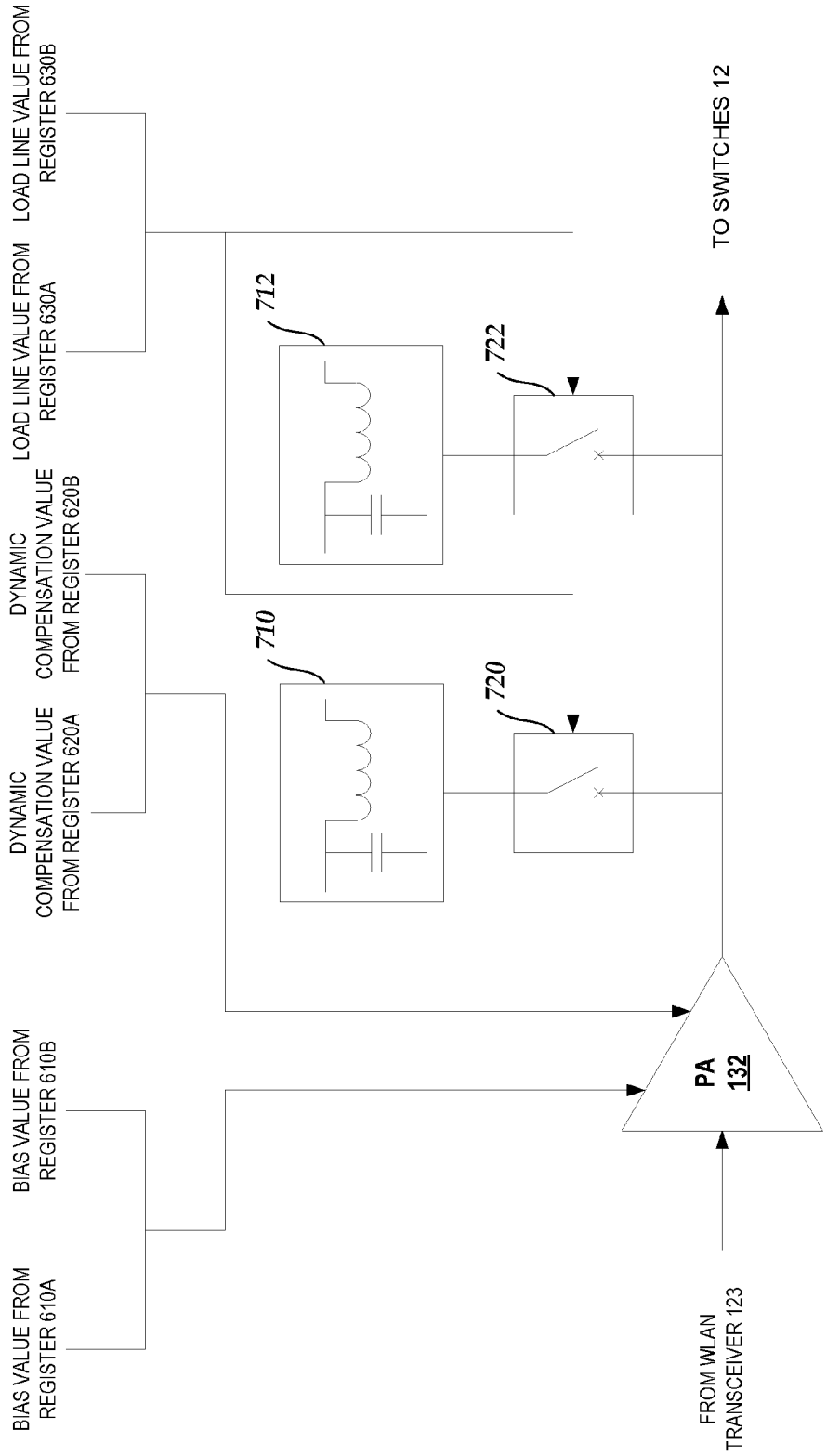
FIG. 7 is a schematic diagram of one embodiment of a power amplifier and matching network.

FIG. 7 is a schematic diagram of one embodiment of a power amplifier, such as the power amplifier 17a of FIG. 2 or the WLAN power amplifier 132 of FIG. 3, and matching networks 710 and 712. The matching networks 710 can include capacitors, inductors, and/or the like that affect the load line of the WLAN power amplifier 132. As illustrated in FIG. 7, the output from registers 610A and 610B can be combined into a single transmission line that is coupled to the WLAN power amplifier 132 (e.g., because register 610A is enabled when register 610B is disabled, and vice-versa), the output from registers 620A and 620B can be combined into a single transmission line that is coupled to the WLAN power amplifier 132 (e.g., because register 620A is enabled when register 620B is disabled, and vice-versa), the output from registers 630A and 630B can be combined into a single transmission line that is coupled to switches 720 and 722 (e.g., because register 630A is enabled when register 630B is disabled, and vice-versa).

As described herein, the outputs generated by registers 610A-B, 620A-B can be used to adjust the bias and dynamic compensation parameters of the WLAN power amplifier 132, respectively. For example, when the supply voltage provided to the WLAN power amplifier 132 changes, the dynamic response of the WLAN power amplifier 132 (e.g., the rate at which the WLAN power amplifier 132 heats up, the rate at which the current in the WLAN power amplifier 132 changes, etc.) can change as well. To account for this change, the bias of the WLAN power amplifier 132 can be adjusted to change the behavior of the WLAN power amplifier 132 (e.g., the drift rate, the ramp rate, peak height, etc.) such that the WLAN power amplifier 132 is optimized for the new supply voltage. The outputs generated by registers 630A and 630B can be used to switch in matching network 710 and/or matching network 712 into the output path of the WLAN power amplifier 132 to affect the load line of the WLAN power amplifier 132. For example, if register 630A is enabled (e.g., meaning that the detected supply voltage is high, 5V, and a high signal is generated by the register 630A), then switch 720 may be enabled and switch 722 may be disabled such that the matching network 710 (which can be optimized for a high supply voltage of 5V) is switched into the output path of the WLAN power amplifier 132. Alternatively, switches 720 and 722 can be enabled when the register 630A is enabled if, for example, the combination of matching networks 710 and 712 is the optimized load for the detected supply voltage. Likewise, switches 720 and 722 can both be disabled when the register 630A is enabled if, for example, the removal of matching networks 710 and 712 causes the load of the WLAN power amplifier 132 to be at the optimized level for the detected supply voltage. The switches 720 and 722 may behave in an opposite manner when the register 630B is enabled (e.g., the switches 720 and 722 may be enabled and/or disabled such that the load is at the optimized level for the detected low supply voltage of 3.3V).

Adjusting the load line in this manner may be beneficial. For example, load lines are typically optimized for a single supply voltage. Thus, if the same load line is used for multiple supply voltages, then the efficiency of the power amplifier may be degraded. Using the stored values in the registers 630A and 630B and the switches 720 and/or 722 can allow the wireless device 11 to select the appropriate load line for the supply voltage provided to the WLAN power amplifier 132.

Example Flowchart for Adjusting a Parameter of a Power Amplifier

Figure 8:
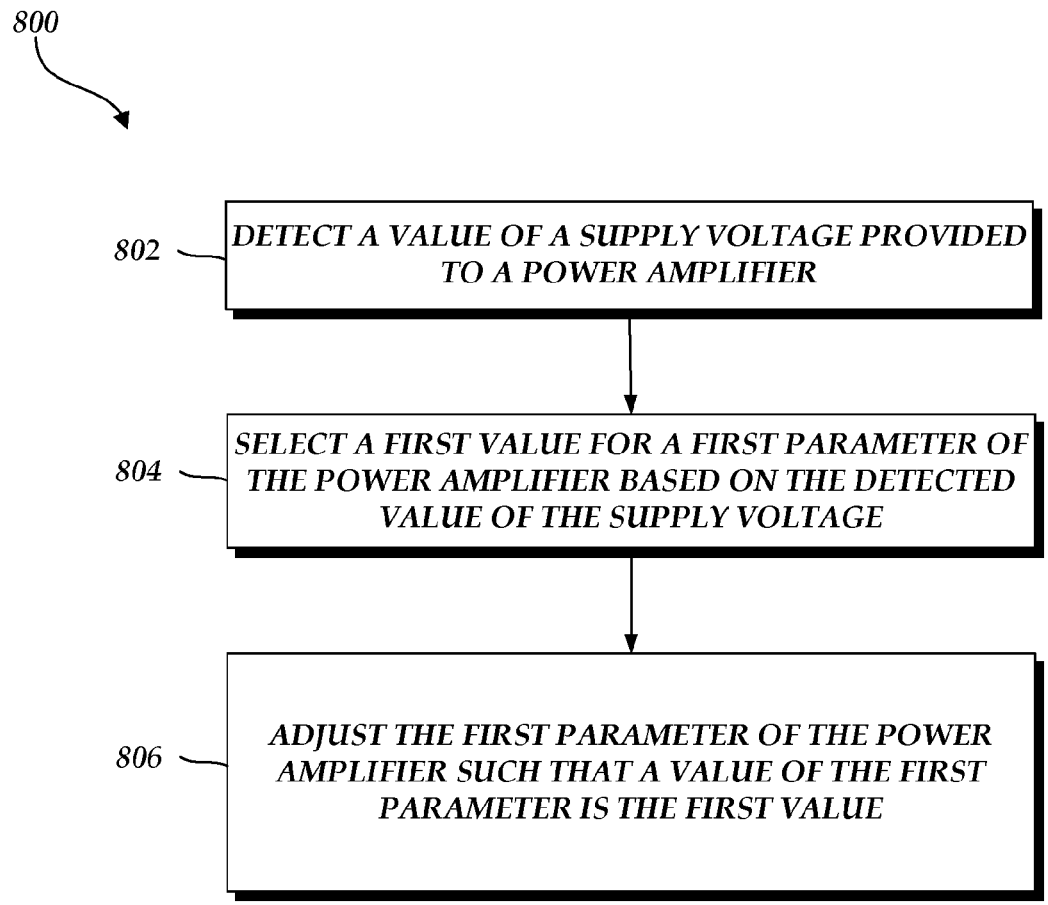
FIG. 8 illustrates an example flowchart of a process for adjusting a parameter of a power amplifier based on a detected supply voltage.

FIG. 8 illustrates an example flowchart of a process 800 for adjusting a parameter of a power amplifier based on a detected supply voltage. The process 800 may be performed by the control component 18 (e.g., the supply voltage detection circuit 310 and/or the parameter controller 320) of FIG. 2. The process 800 may include fewer or additional steps than are illustrated in FIG. 8. Furthermore, the process 800 may perform the steps illustrated in FIG. 8 in any order.

At block 802, a value of a supply voltage provided to a power amplifier is detected. The value of the supply voltage can be one of a selection of expected values. The supply voltage can be detected using a comparator and comparing the supply voltage to a reference voltage.

At block 804, a first value for a first parameter of the power amplifier is selected based on the detected value of the supply voltage. For example, two values for the first parameter may be stored in registers (or a table or other such data storage structure). The first value may be optimized for a first supply voltage and the second value may be optimized for a second supply voltage. In response to detected that the supply voltage is the first supply voltage, the first value is selected. In further embodiments, the temperature is detected and factors into the decision of which value to select for the first parameter.

At block 806, the first parameter of the power amplifier is adjusted such that a value of the first parameter is the first value. The value of the first parameter can be adjusted by having the parameter controller 320 provide the first value to the power amplifier. Alternatively, the parameter controller 320 can enable a switch to causes the first value to be provided to the power amplifier and/or that causes a matching structure to be inserted into the output signal path of the power amplifier.

Applications

Some of the embodiments described above have provided examples in connection with wireless devices or mobile phones. However, the principles and advantages of the embodiments can be used for any other systems or apparatus that have needs for supply voltage detection and adjusting parameters based on the detected supply voltage.

Such power amplifiers that can be used over a wide range of supply voltages can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

As an example, such power amplifiers can be implemented in electronic devices that operate in two or more power modes, such as a low power mode and a high power mode. For example, some electronic devices operate in a sleep or low power mode when not in use and then switch to an active or high power mode when in use. Instead of including two separate power amplifiers in the electronic device, one for each mode, the same power amplifier can be used in either mode by implementing the components and techniques described herein. Furthermore, even if the electronic device only operates in one mode or has a constant supply voltage, the same power amplifier and/or the same control component 18 can be manufactured for all electronic devices, regardless of the supply voltage used by the components in the electronic device, by implementing the components and techniques described herein.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of adjusting a parameter of a power amplifier comprising:
   detecting a value of a supply voltage provided to the power amplifier;
   selecting a first value from a plurality of values for a first parameter of the power amplifier based on the detected value of the supply voltage; and
   adjusting the first parameter of the power amplifier to the first value by switching a matching structure into an output signal path of the power amplifier.

2. The method of claim 1 wherein detecting a value of a supply voltage provided to the power amplifier includes comparing the supply voltage to a reference voltage to detect the value of the supply voltage.

3. The method of claim 1 further comprising detecting a value of a temperature of the power amplifier.

4. The method of claim 3 wherein selecting a first value from a plurality of values for a first parameter of the power amplifier includes selecting the first value based on the detected value of the supply voltage and the detected value of the temperature of the power amplifier.

5. The method of claim 1 wherein the first parameter is at least one of a bias, a dynamic compensation, or a load line.

6. A power amplifier parameter control system comprising:
   a power amplifier configured to amplify a radio frequency signal;
   a supply voltage detection circuit configured to detect a supply voltage provided to the power amplifier;
   a switch;
   a matching circuit coupled to the switch, the matching structure including at least one capacitor and at least one inductor; and
   a parameter controller configured to select a first value from a plurality of values for a first parameter of the power amplifier based on the detected value of the supply voltage, the parameter controller further configured to set the first parameter of the power amplifier to the first value, the parameter controller further configured to enable the switch to switch the matching structure into an output signal path of the power amplifier such that the value of the first parameter is the first value.

7. The power amplifier parameter control system of claim 6 wherein the supply voltage detection circuit includes a comparator configured to compare the supply voltage to a reference voltage to detect the value of the supply voltage.

8. The power amplifier parameter control system of claim 6 wherein the matching structure includes at least one capacitor and at least one inductor.

9. The power amplifier parameter control system of claim 6 wherein the parameter controller includes a plurality of registers that each store one value from the plurality of values.

10. The power amplifier parameter control system of claim 6 wherein the supply voltage detection circuit includes a diode and a voltage detector configured to detect a value of a voltage across the diode, the value of the voltage indicating a temperature value.

11. The power amplifier parameter control system of claim 10 wherein the parameter controller is configured to select the first value based on the detected value of the supply voltage and the indicated temperature value.

12. The power amplifier parameter control system of claim 6 wherein the first parameter is at least one of a bias, a dynamic compensation, or a load line.

13. A wireless device comprising:
a transceiver configured to generate a first radio frequency signal;
a power amplifier configured to amplify the first radio frequency signal;
a switch;
a matching structure coupled to the switch, the matching structure including at least one capacitor and at least one inductor; and
a control component configured to detect a supply voltage provided to the power amplifier, the control component configured to select a first value from a plurality of values for a first parameter of the power amplifier based on the detected value of the supply voltage, the control component configured to set the first parameter of the power amplifier to the first value, the control component further configured to enable the switch to switch the matching structure into an output signal path of the power amplifier such that the value of the first parameter is the first value.

14. The wireless device of claim 13 wherein the control component includes a comparator configured to compare the supply voltage to a reference voltage to detect the value of the supply voltage.

15. The wireless device of claim 13 wherein the matching structure includes at least one capacitor and at least one inductor.

16. The wireless device of claim 13 wherein the control component includes a plurality of registers that each store one value from the plurality of values.

17. The wireless device of claim 13 wherein the first parameter is at least one of a bias, a dynamic compensation, or a load line.

* * * * *

UNITED STATES PATENT AND TRADEMARK OFFICE
CERTIFICATE OF CORRECTION

PATENT NO. : 10,038,405 B2  
APPLICATION NO. : 15/280671  
DATED : July 31, 2018  
INVENTOR(S) : Grant Darcy Poulin Page 1 of 1

It is certified that error appears in the above-identified patent and that said Letters Patent is hereby corrected as shown below:

On the Title Page

Item (72), Inventors at Line 4, Change "Bishop's Storford" to --Bishop's Stortford--.

Signed and Sealed this
Twentieth Day of November, 2018

Andrei Iancu
*Director of the United States Patent and Trademark Office*